US011894278B2

(12) United States Patent
Kim et al.

(10) Patent No.: US 11,894,278 B2
(45) Date of Patent: Feb. 6, 2024

(54) GIS-BASED METHOD FOR PRODUCING SPATIAL WAFER MAP, AND METHOD FOR PROVIDING WAFER TEST RESULTS USING SAME

(71) Applicant: APHROSYS CO.,LTD., Anyang-si (KR)

(72) Inventors: Bu Young Kim, Seoul (KR); Sang Heon Lee, Goyang-si (KR); Wang Kook Im, Suwon-si (KR); Sung Hwan Park, Incheon (KR)

( * ) Notice: Subject to any disclaimer, the term of this patent is extended or adjusted under 35 U.S.C. 154(b) by 0 days.

(21) Appl. No.: 17/926,185

(22) PCT Filed: Oct. 6, 2021

(86) PCT No.: PCT/KR2021/013696
§ 371 (c)(1),
(2) Date: Nov. 18, 2022

(87) PCT Pub. No.: WO2022/080740
PCT Pub. Date: Apr. 21, 2022

(65) Prior Publication Data
US 2023/0238288 A1   Jul. 27, 2023

(30) Foreign Application Priority Data
Oct. 14, 2020 (KR) .......................... 10-2020-013835

(51) Int. Cl.
*H01L 21/66* (2006.01)
(52) U.S. Cl.
CPC .............. *H01L 22/12* (2013.01); *H01L 22/26* (2013.01)

(58) Field of Classification Search
CPC ............................... H01L 22/12; H01L 22/26
See application file for complete search history.

(56) References Cited

U.S. PATENT DOCUMENTS

| | | | |
|---|---|---|---|
| 2006/0031801 A1* | 2/2006 | McIntyre | G06F 30/392 716/55 |
| 2019/0221485 A1 | 7/2019 | Nakamura et al. | |
| 2021/0066140 A1* | 3/2021 | Hyun | H01L 21/6715 |

FOREIGN PATENT DOCUMENTS

| | | |
|---|---|---|
| CN | 1913118 A | 2/2007 |
| JP | 2007-165930 A | 6/2007 |

(Continued)

OTHER PUBLICATIONS

English Specification of JP2007-165930A.
(Continued)

*Primary Examiner* — Roy M Punnoose
(74) *Attorney, Agent, or Firm* — ANTONIO HA & U.S. PATENT, LLC

(57) ABSTRACT

Disclosed is a method for producing a wafer map. More specifically, the present invention relates to: a method for producing a wafer map used for manufacturing chips in the semiconductor field, wherein a geographic information system (GIS) technique is used to produce the wafer map; and a method and system for providing wafer test results using same. According to an embodiment of the present invention, a semiconductor wafer is formed as a map by using the GIS technique, a coordinate system used in the GIS is utilized to create a map of the same size as an actual semiconductor wafer, and each of various constituent elements constituting the wafer can be stratified to reflect the actual size of the element to create a wafer map in which each of the elements is geocoded.

7 Claims, 16 Drawing Sheets

(56) References Cited

FOREIGN PATENT DOCUMENTS

| | | |
|---|---|---|
| JP | 2007-335785 A | 12/2007 |
| KR | 10-0288907 | 6/2001 |
| KR | 10-2007-0070903 | 7/2007 |
| KR | 10-2008-0111105 | 12/2008 |

OTHER PUBLICATIONS

English Specification of 10-2007-0070903.
English Specification of JP2007-335785A.
English Specification of 10-2008-0111105.
English Specification of 10-0288907.
English Specification of CN1913118A.

\* cited by examiner

FIG. 9
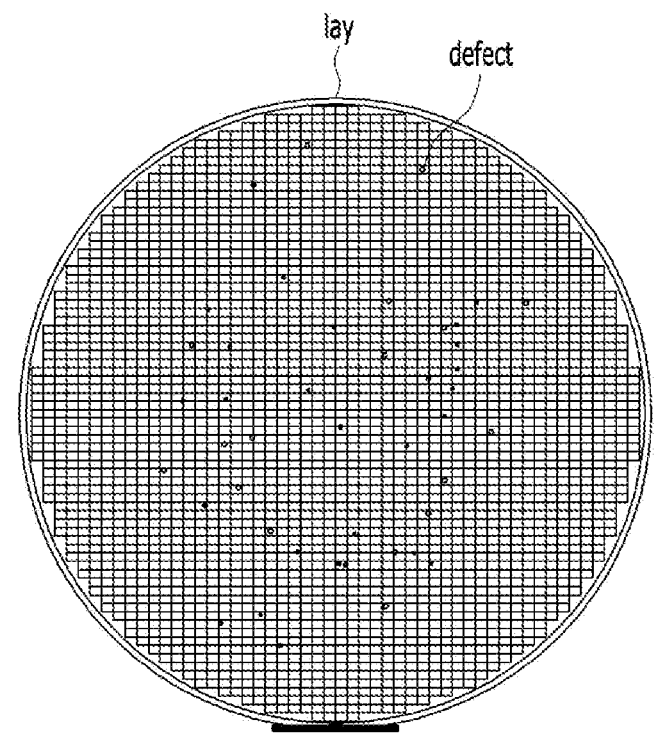
(a)
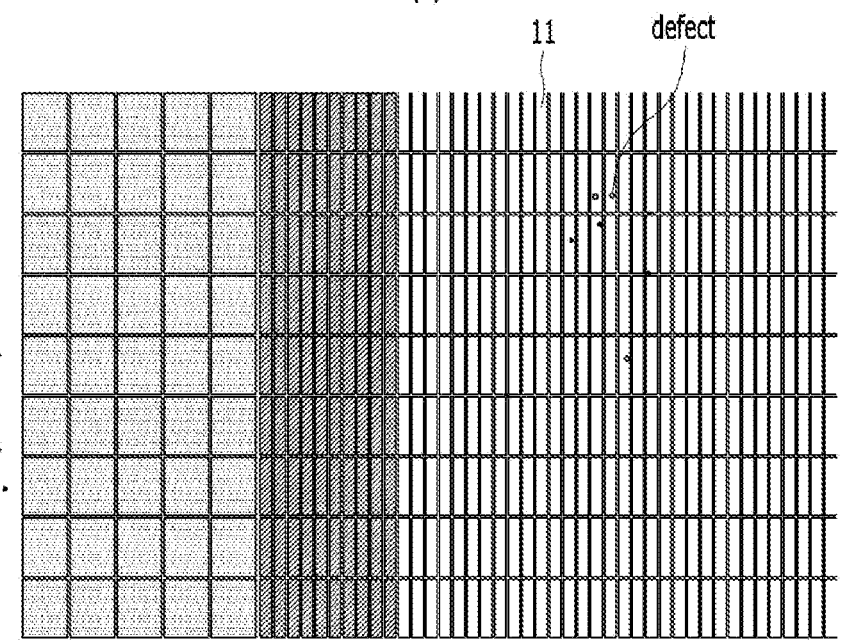
(b)

GIS-BASED METHOD FOR PRODUCING SPATIAL WAFER MAP, AND METHOD FOR PROVIDING WAFER TEST RESULTS USING SAME

TECHNICAL FIELD

The present invention relates to a method for preparing a wafer map, and more particularly, to a method for preparing a wafer map used for manufacturing a chip in a semiconductor field by applying a geographic information system (GIS) technique and a method and system for providing a wafer test result using the same.

BACKGROUND ART

As is known, a semiconductor wafer, as a material for manufacturing CPU, memory, LED, etc., includes a plurality of components, including a cell, a mat, a bank, a chip, and the like.

However, there is no way to visualize the correlation between each component constituting the wafer so far, and accordingly, there is a need to implement a wafer map for the components.

In particular, as semiconductor technology is advanced, the importance of process management is emerging along with the development of device design technology and unit process technology. To improve the yield of semiconductor production, it is indispensable to minimize defects through process technology innovation. Accordingly, it can be said that a series of processes are required to detect and analyze various defects scattered on the wafer during the development and production of optimized process technology and use them as data for optimal process setting of manufacturing equipment.

Further, in the wafer manufacturing process, a chip unit test and a cell unit test are performed for each process, and the test is carried out in each step, such as the step of producing each chip, the step of packaging the produced chip, and the step of modularizing it. In a situation where there is an increasing demand for cell unit tests to determine whether to use chips more accurately through these tests, various analysis methods are required to improve wafer yield by visualizing various test results, identifying failures, and identifying the causes.

Prior art documents related to the present application include Korean Patent Publication No. 10-0288907 (published on Jun. 1, 2001).

DISCLOSURE

Technical Problem

The present invention has been devised to solve the above problems, and an object of the present invention is to provide a way to define correlations for various components constituting a semiconductor wafer and a method and system capable of analyzing test results for a wafer manufacturing process.

Further, another object of the present invention is to provide a method and system that may produce a wafer map using vector-based spatial data by realizing the cells, mats, banks, and chips constituting the wafer. The invention utilizes wafers as a layer to which a coordinate system is applied. It may apply GIS analysis techniques such as pattern analysis and correlation analysis through overlap by producing various test results for each semiconductor production process in a thematic map layer.

Technical Solution

In order to solve the above problems, the method for producing the GIS-based spatial wafer map according to an embodiment of the present invention may comprise: step (a) of producing a circular layer corresponding to the horizontal and vertical dimensions of an actual semiconductor wafer; step (b) of producing an edge region on the circular layer; step (c) of producing one central chip with reference to the size of one of the chips on the central point of the circular layer; step (d) of repeatedly producing chips having the same size as the central chip sequentially from the central chip to the edge region using the size of chips and a gap between chips; step (e) of producing, when the produced chips reach the edge region, a chip layer including all chips on the circular layer; and step (f) of producing a dynamic wafer map by producing each layer for a plurality of components included in one chip.

The method may further comprise, between steps (b) and (c), step (b 1) of producing a flat zone on the circular layer in which the edge region is set.

The plurality of components may include a plurality of banks included in one of the chips, a mat that divides one of the banks into multiple parts, and a plurality of cells included in one of the mats.

The step (f) may comprise: step (f1) of producing a bank list based on the number of banks in the column and row directions included in chips; step (f2) of producing a bank layer based on the size of banks and the gap between banks; step (f3) of producing a mat list according to a bank type designated for each of banks; and step (f4) of producing a mat layer based on the size of mats and the gap between mats.

The method may comprise, after step (f4), step of (f5) defining the dummy cell area, the main cell area, and the redundant cell area included in one of the cells; step of (f6) producing a plurality of dummy cells based on a gap between cells in the dummy cell area; step of (f7) producing a plurality of main cells based on the number of main cells and a gap between main cells in the main cell area; step of (f8) producing a plurality of redundant cells based on the number of redundant cells and a gap between redundant cells in the redundant cell area; and step of (f9) producing a cell layer by dividing the dummy cell area, the main cell area, and the redundant cell area, respectively.

Further, the method for preparing the GIS-based spatial wafer map may be implemented by a program performing the same and recorded in a computer-readable recording medium.

Further, to solve the above problems, a method for providing a wafer test result using the GIS-based spatial wafer map according to an embodiment of the present invention may comprise step (g) of receiving result data according to a wafer test performed in any one of a wafer unit, a cell unit, and a chip unit; step (h) of extracting the position coordinates of the defect or fail included in the result data; step (i) of converting the position coordinates into a coordinate system of the wafer map; and step (j) of mapping the position coordinates of defects or fails according to a coordinate system converted to a corresponding one of a plurality of layers included in the wafer map to points on each layer.

The coordinate system may be expressed by X, Y indices that are individually defined for each chip layer and the wafer map cell layer.

The method may comprise, after step (j), step (k) of deriving problems in the production process by analyzing pattern information between a plurality of points by overlapping two or more of the plurality of layers included in the wafer map and displaying the same in the graphic.

Further, the method for preparing the method for providing a wafer test result using the method for preparing the GIS-based spatial wafer map may be implemented by a program performing the same and recorded in a computer-readable recording medium.

Advantageous Effects

According to an embodiment of the present invention, a semiconductor wafer is implemented as a map using a geographic information system (GIS) technique, and a map identical to the size of an actual semiconductor wafer is generated using the coordinate system used in GIS, and the actual sizes of the various components constituting the wafer are reflected followed by layering them to create a wafer map in which each component is spatialized.

Further, the present invention spatializes cell test results, chip test results, and defect detection results that are caused during the semiconductor wafer production process and visualizes patterns and spatial analysis results for defects using wafer maps and GIS analysis techniques to increase the yield of wafers.

DESCRIPTION OF DRAWINGS

FIGS. 9, 10, 11 and 12 are views illustrating wafer test results derived by a method for providing a wafer test result using a method for producing the GIS-based spatial wafer map according to an embodiment of the present invention.

MODE FOR INVENTION

Figure 1:
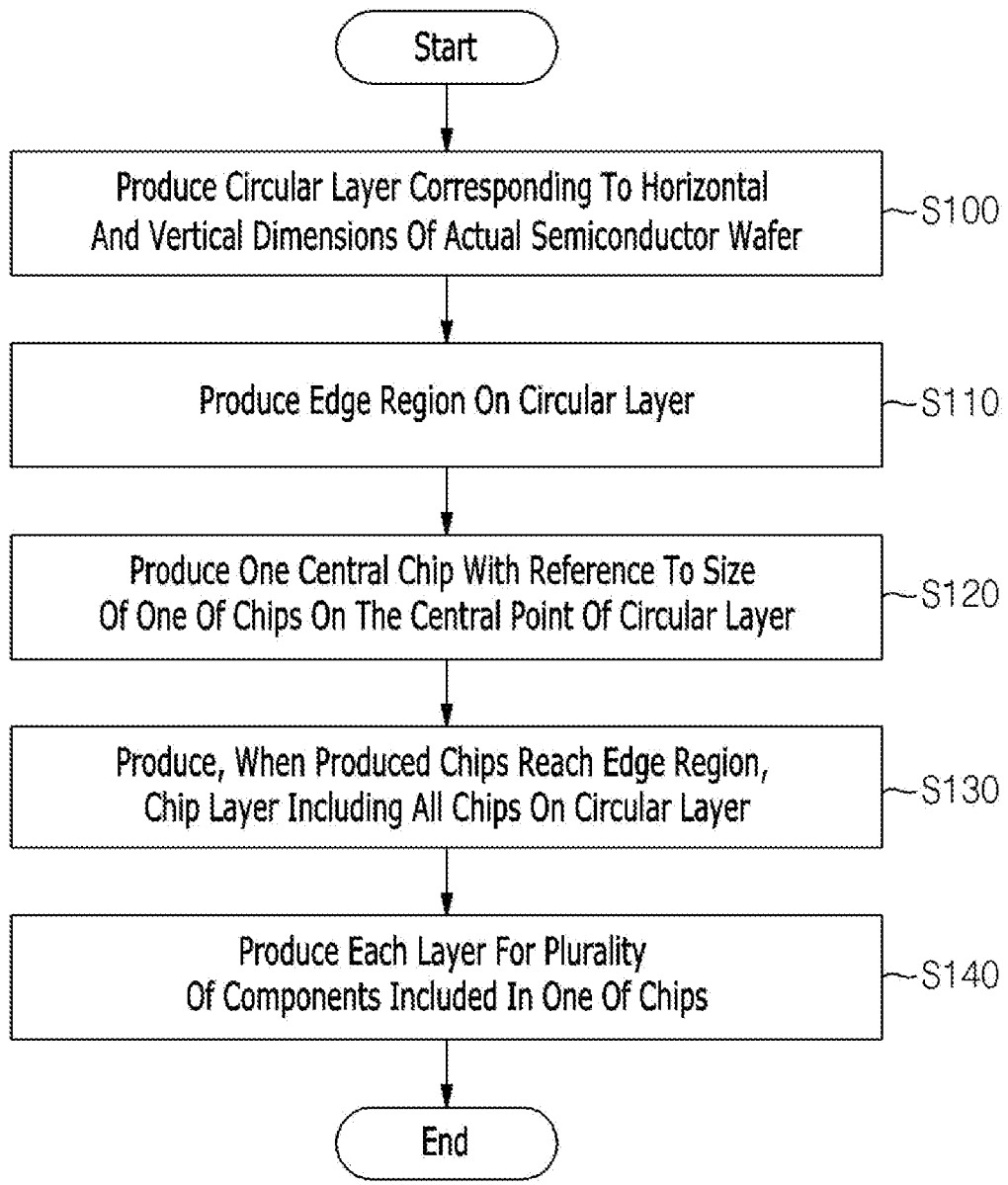
FIGS. 1, 2 and 3 are views illustrating the GIS-based spatial wafer map generation method according to an embodiment of the present invention.

Advantages and features of the present invention and methods for achieving the same are apparent with reference to the embodiments described below in detail in combination with the accompanying drawings. However, the present invention is not limited to the embodiments disclosed below but may be implemented in various forms. Only the present embodiments allow the disclosure of the present invention to be complete. The present embodiments are provided to fully inform those of ordinary skill in the art to which the present invention pertains, the scope of the present invention. The present invention is only defined by the scope of the claims.

The term used herein is for the purpose of describing the embodiments and is not intended to limit the present invention. In this specification, the singular also includes the plural unless specifically stated otherwise in the phrase. As used herein, the term "comprises" or "comprising" does not exclude the presence or addition of one or more other components in addition to the stated components. Like reference numerals refer to like elements throughout the specification and include each and every combination of one or more of the recited components. Although "first," "second," etc. are used to describe various components, these components are not limited by these terms. These terms are only used to distinguish one component from another. Accordingly, the first component mentioned below may be the second component within the spirit of the present invention.

Further, unless otherwise defined, all terms used in this specification may be used with a meaning commonly understood by those skilled in the art to which the present invention belongs. Further, terms defined in a commonly used dictionary are not to be interpreted ideally or excessively unless specifically defined explicitly.

Spatially relative terms "below," "beneath," "lower," "above," "upper," etc. can be used to easily describe the correlation between one component and another component, as shown in the drawings. Spatially relative terms should be understood as terms including different directions of components during use or operation in addition to the directions shown in the drawings. For example, when a component shown in the drawing is turned over, a component described as "below" or "beneath" of another component may be placed "above" of another component. Accordingly, the exemplary term "below" may include both directions below and above. Components may also be oriented in other orientations, and thus spatially relative terms may be interpreted according to orientation.

In the following description, the terms "method for producing GIS-based spatial wafer map" and "method for providing wafer test result using method for producing GIS-based spatial wafer map," respectively, may be abbreviated as "a method for producing a wafer map" and "a method for providing a wafer test result" for convenience of description.

Hereinafter, a method for producing the GIS-based spatial wafer map and a method for providing wafer test results using the same according to an embodiment of the present invention are described in detail with reference to the drawings.

Figure 2:
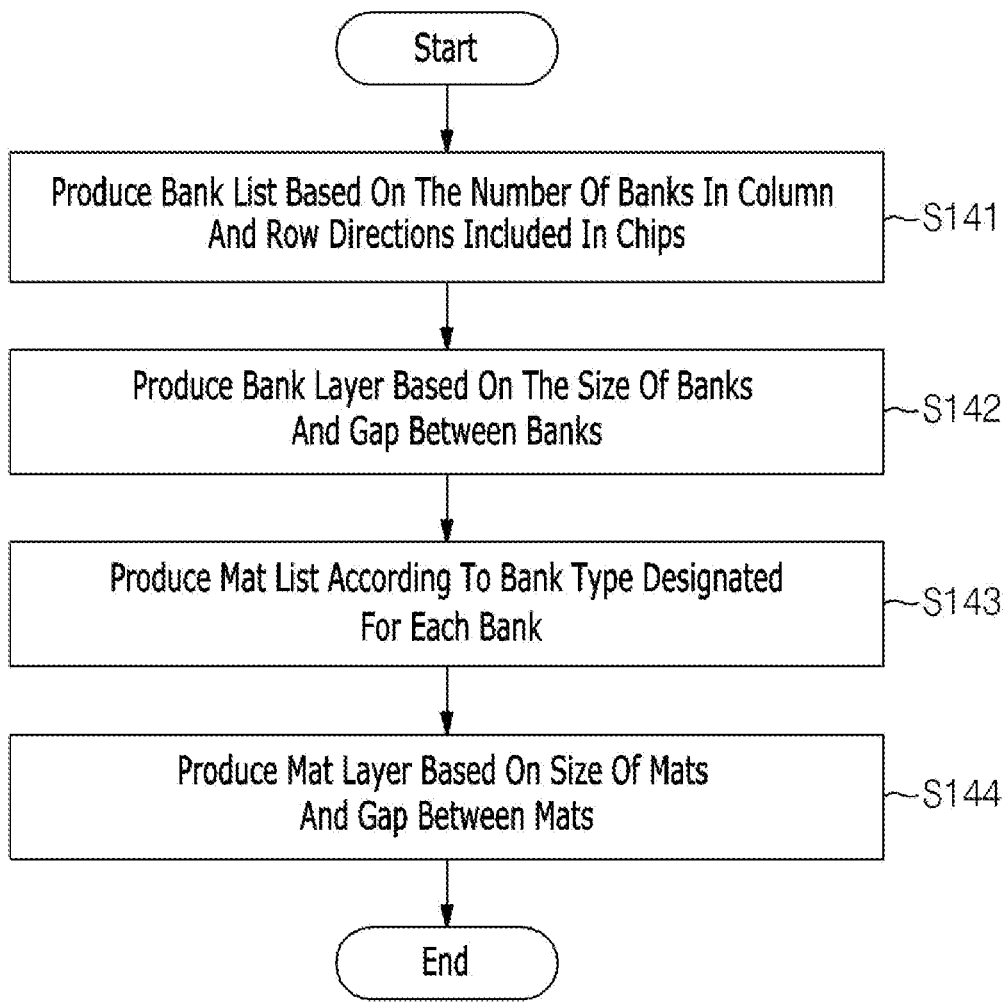
Figure 3:
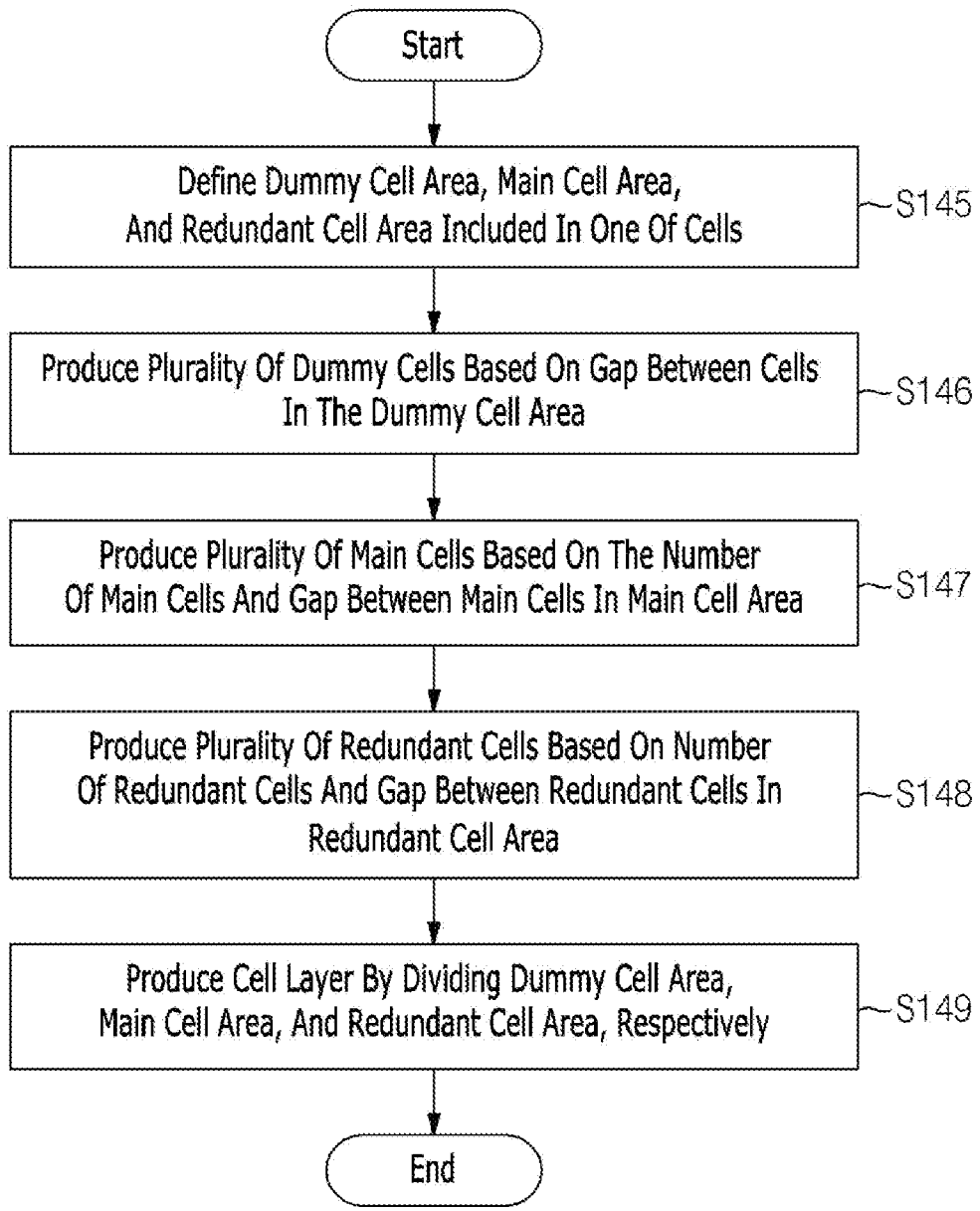
Figure 4:
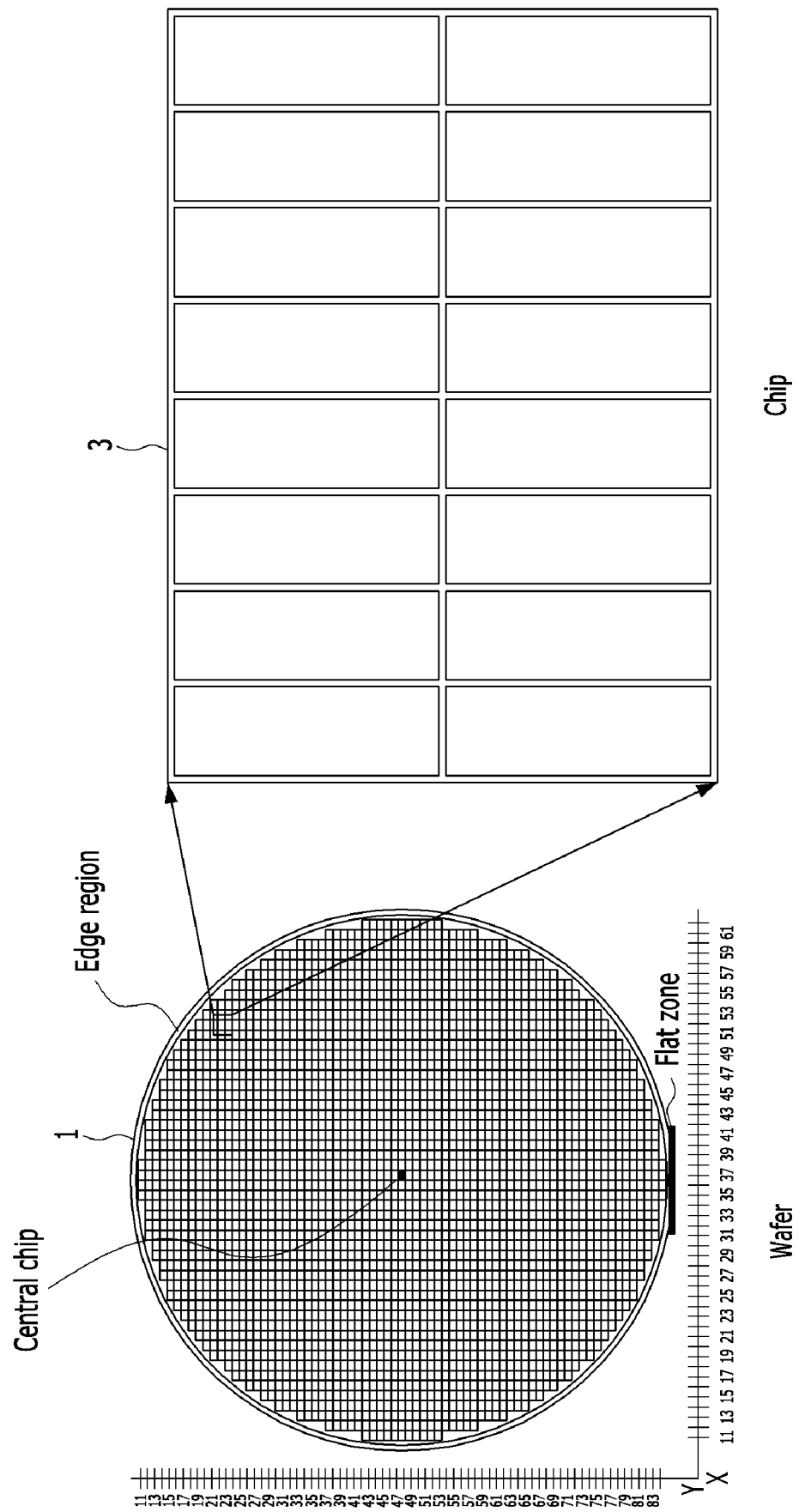
FIGS. 4, 5, 6, and 7 are views schematically illustrating components of a wafer map used in the method for producing the GIS-based spatial wafer map according to an embodiment of the present invention.

FIGS. 1, 2, and 3 are views illustrating a method for producing the GIS-based spatial wafer map according to an embodiment of the present invention and FIGS. 4, 5, 6, and 7 are views schematically showing the components of the wafer map used in a method for producing GIS-based spatial wafer map according to an embodiment of the present invention.

For the method of producing a wafer map according to an embodiment of the present invention, the geographic information system (GIS) technique is applied to the wafer map generation to enable generally display, create, search for, and analyze facilities on the map along with topographic information. The method provides a wafer map reflecting spatial information of each component by layering them in consideration of the sizes of a plurality of components, such as chips, banks, and mats, that constitute a semiconductor wafer based on the coordinate system used in GIS.

To this end, according to an embodiment of the present invention, a mat composed of cells, which is a basic unit constituting a wafer map, is defined, a bank composed of mats is defined, and the structure of a chip composed of banks is defined.

Each chip may be generated in up, down, left, and right directions, considering the gap with an adjacent chip in the size of the input chip based on the central point of the wafer.

Unlike the conventional wafer map, the structure inside the chip can be expressed as a single structure in this way. Based on this, a relationship between each component can be established, and a wafer map that can express test results in units of cells can be constructed.

A unit used in a conventional semiconductor is a nanometer. Accordingly, it can be converted into meters for use in the present invention, and each component can be defined and expressed only with information about the central point, the sizes of the respective components, and the distance between components.

In particular, since many mats have the same cell structure due to the characteristics of semiconductor design, it is possible to prevent repetitive input by implementing the mat type without inputting resources for all mats. Further defining a bank composed of a mat can be configured to express a repetitive structure by specifying only the type for each map. Further, it can be configured to define the bank type similarly.

Accordingly, in the embodiment of the present invention, spatial data for each component is dynamically generated based on input information without storing the wafer map as spatial data such as a shape file, and the spatial data is layered. Thus, a regular wafer map may be generated.

Therefore, wafer and chip structures can be spatialized and implemented using actual chip design specifications, and various semiconductor design specifications can be flexibly reflected.

In the following description, the execution entity of each step is the system and its components shown in FIGS. 13 and 14, as described later, even if there is no separate description. In the following description, the execution entity of each step is the system and its components shown in FIGS. 13 and 14, which will be described later, even if there is no separate description. A known microprocessor may execute such a system, be implemented as a computer program readable by a computer and be recorded in a readable and writable recording medium.

FIGS. 1, 2, and 3 are views showing a method for producing a wafer map according to an embodiment of the present invention based on the above technical idea and FIGS. 4, 5, 6, and 7 are views schematically illustrating components of a wafer map used in a method for producing the GIS-based spatial wafer map according to an embodiment of the present invention.

Referring to FIGS. 1, 2, 3, and 4, it can be implemented in step (s100) of producing a circular layer 1 corresponding to the horizontal and vertical dimensions of an actual semiconductor wafer, step (s110) of producing an edge region on the circular layer 1, step (s120) of producing one central chip with reference to the size of a chip 3 on the central point of the circular layer 1, step (s130) of repeatedly producing chips 3 having the same size as the central chip sequentially from the central chip to the edge region using the size of the chip 3 and the distance between chips 3, step (s140) of producing, when the produced chips 3 reach the edge region, a chip layer including all chips on the circular layer 1, and step (s150) of producing a dynamic wafer map by producing each layer for a plurality of components included in one chip.

First, the step (s100) of producing the circular layer 1 corresponding to the horizontal and vertical sizes of the actual semiconductor wafer is a procedure of producing a layer serving as a base of the wafer map. In this step, the horizontal and vertical sizes of the actual semiconductor wafer to be implemented as a wafer map are received to generate a corresponding circular layer 1.

As an example, the wafer size may be defined in the form of variables of "width=300000000;" and "height=300000000;" on the system.

Next, the step (s110) of producing the edge region on the circular layer 1 is a step of receiving an operation value for the edge region of the wafer and reflecting it on the aforementioned circular layer. The radius of the edge region may be calculated by subtracting the input value of the edge data from the radius of the wafer.

The operation value of the edge area may be in the form of "edge=3000000;".

Further, although not shown, the method may further comprise, after step (s110), the step of producing a flat zone on the circular layer 1 in which an edge region is set. This flat zone is created to identify the vertical and front-to-back direction of the wafer and may be replaced with a notch or the like depending on the process.

The location of the flat zone may be defined in the form of "flatzone=flatzonetype.bottom;".

Next, in step (s120) of producing one central chip with reference to the size of one chip 3 on the central point of the circular layer 1, the central point of the produced circular layer 1 is found, and one central chip may be generated based on the central point. In this case, the chip 3 may have a polygonal shape and can be generated by inputting the size of one chip 3 formed on the actual wafer and substituting it for the central point.

A variable representing a criterion for producing a chip at the central point may be defined in the form of "baselinex=baselinetype.chip", "baseliney=baselinetype.scribe," and may be referred to as a reference point for producing a chip 3 on the remaining region to be described later.

Next, in step (s130) of repeatedly producing chips 3 having the same size as the central chip sequentially from the central chip to the edge region using the size of the chip 3 and the distance between chips 3, the same chip 3 is generated in the entire area of the circular layer 1 in a form that surrounds the central chip using the size and gap of the chip 3 based on the central chip generated in step s120. That is, the chips of the same size are sequentially generated by moving in the up, down, left, and right directions based on the above-described central chip by reflecting the gap between the input chips 3.

Here, the gap between chips 3 may be defined in the form of "scribe.x=7000;", "scribe.y=7000," and the moving distance from the current position (the central chip or the neighboring generated chip) may be set as a variable having an initial value of "shift.x=0;" and "shift.y=0;", and the value may be added according to the moving distance of the chip.

Further, the increase/decrease direction of the x and y axes of the chip 3 may be set as a variable of "direct=leftbottom_horizontalx_verticaly;".

Next, in step (s140) of producing, when the produced chips 3 reach the edge region, a chip layer including all chips on the circular layer 1, The chip 3 generated by repeating step s130 arrives from the central point of the wafer to the end, that is, to the edge region, to determine whether an intersect has occurred, determine whether to create a new chip according to the size of the remaining space in the edge area, and generate a list of all chips on the entire circular layer 1 including the edge region, thereby producing a chip layer.

Then, in step (s150) of producing a dynamic wafer map by producing each layer for a plurality of components included in one chip 3, a procedure for creating layers for banks, mats, and cells, which is described later, is performed.

Figure 5:
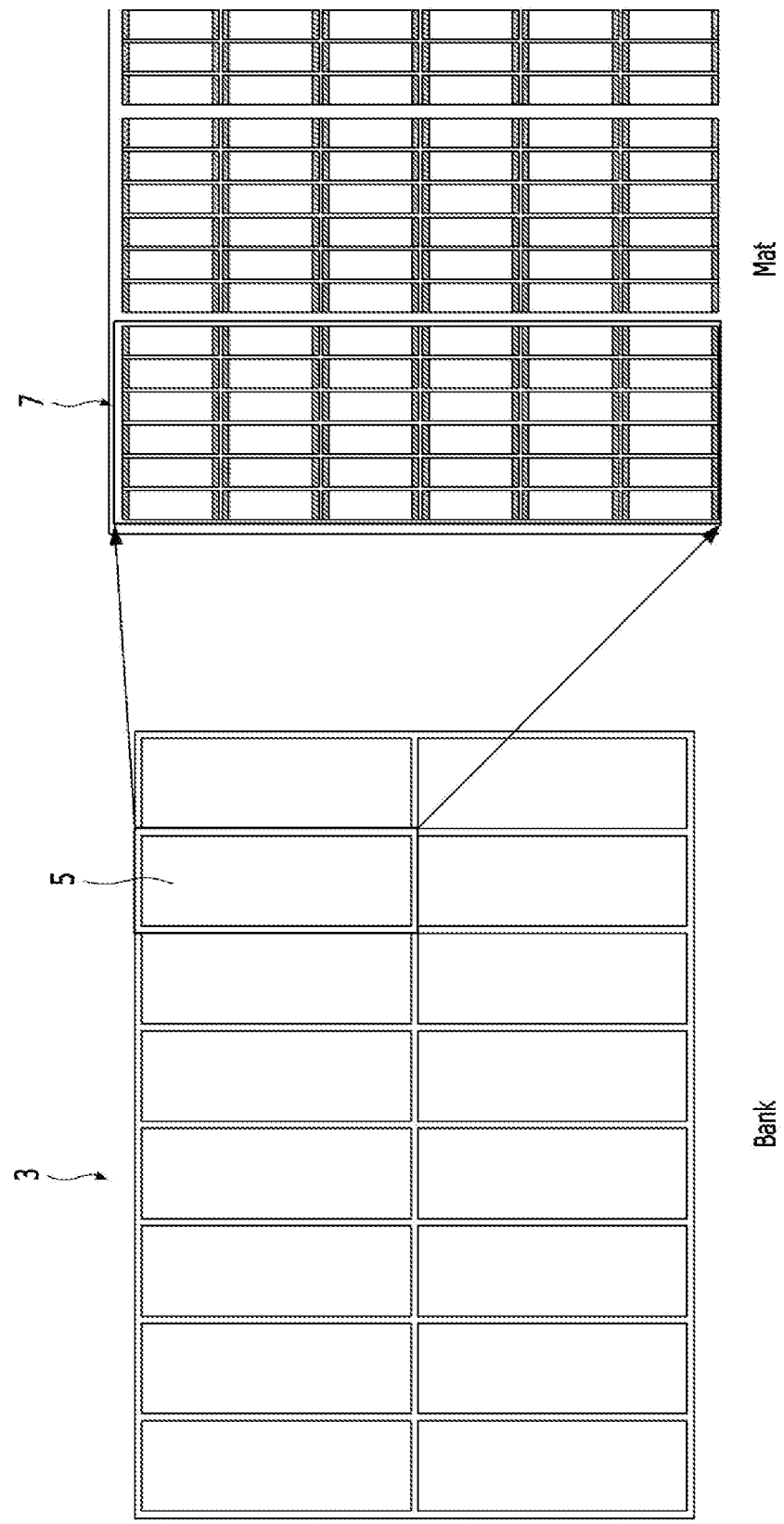

Referring to FIGS. 2 and 5, they show a method for producing a bank 5 and a mat according to an embodiment of the present invention. The method may comprise step (s141) of producing a bank list based on the number of banks 5 in the column and row directions included in the chip 3, step (s142) of producing a bank layer based on the size of the bank 5 and the gap between banks 5, step (s143) of producing a mat list according to a bank type designated for each bank; and step (s144) of producing a mat layer based on the size of the mat 7 and the gap between mats 7.

The step (s141) of producing a bank list based on the number of banks 5 in the column and row directions included in the chip 3 is a step of producing a bank list for a bank 5 in one chip 3. Since all the chips 3 produced on one wafer have the same shape except for some edge regions, Banks 5 for all chips 3 are created using only the form of bank 5 for one chip 3. As data for this purpose, a bank list is generated according to the number of banks 5 in the column and row directions in one chip 3.

As an example, the size for one chip 3 may be "width=5577000;" and "height=4000000;", and the number of banks 5 may be defined in the form of "col=6;" and "row=6;".

Next, in the step (s142) of producing a bank layer based on the size of the bank 5 and the gap between banks 5, a bank layer is created by creating a plurality of banks 5 included in one chip 3 with reference to the above bank list. The number of banks 5 in the column and row directions formed in one chip 3 is defined in the bank list. A bank 5 for one chip 3 is created by inputting a size for one bank 5 and a gap between the banks 5, and a bank layer for the entire bank 5 may be produced based on this.

The size of the bank 5 may be defined as a variable of "width=77000;" and "height=40000;", and the gap between the banks 5 may be defined as a variable of "setgapx (50000);" and "setgapy(50000);".

Next, in the step (s143) of producing a mat list according to a bank type designated for each of banks, a list of mats 7 according to a bank type designated for each of the banks 5 in the step of producing the bank layer may be produced.

Next, the method may comprise step (s144) of producing a mat layer based on the size of the mat and the gap between mats. A plurality of mats 7 are formed in each bank 5, and a mat 7 for one bank 5 is produced by inputting a size for each of mats 7 and a gap between mats 7 with reference to the above mat list, and a mat layer for the entire mats may be produced.

The gap between the mats 7 may be defined as a variable of "setgapx(50000);" and "setgapy(50000);".

Figure 6:
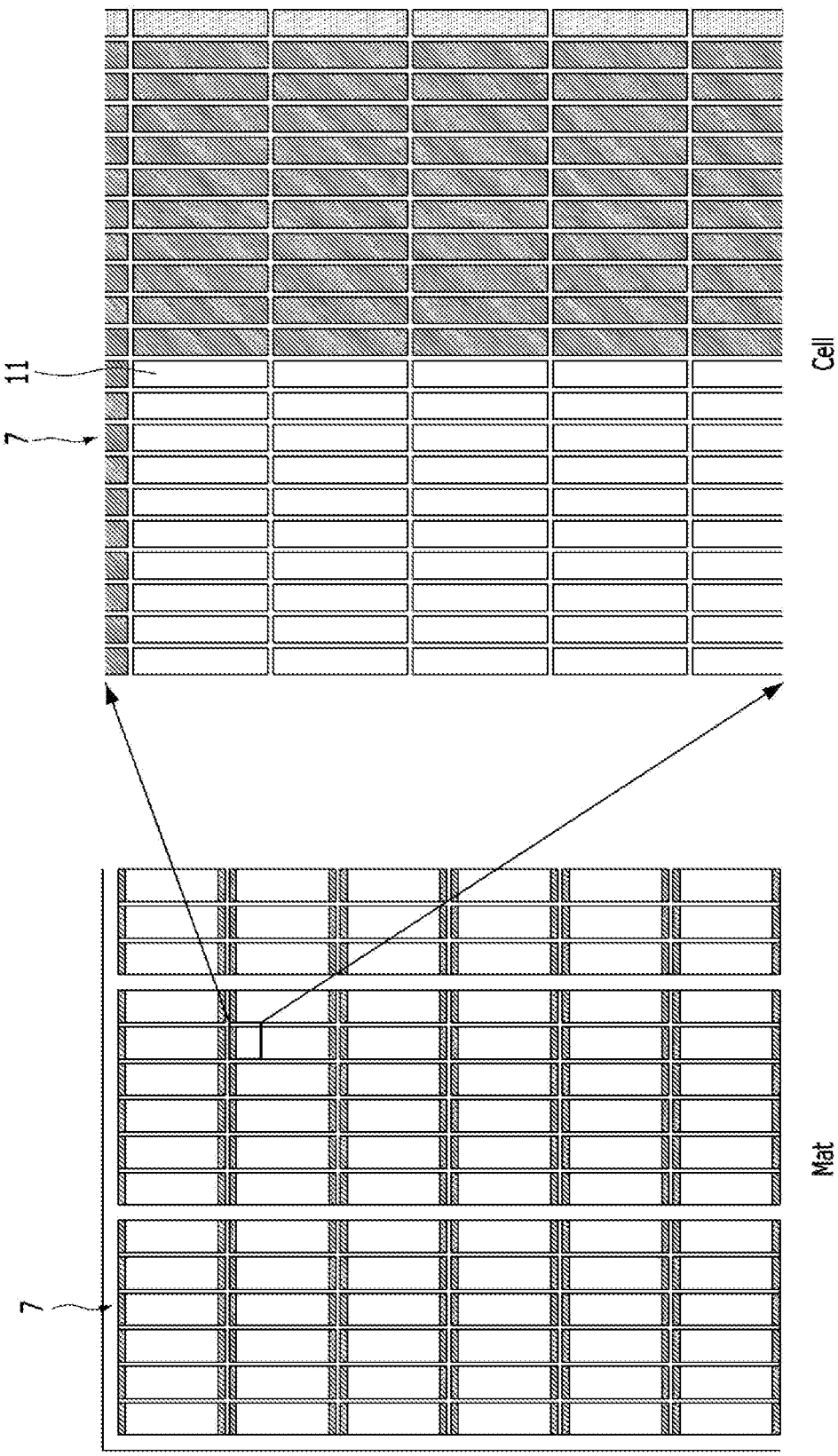
Figure 7:
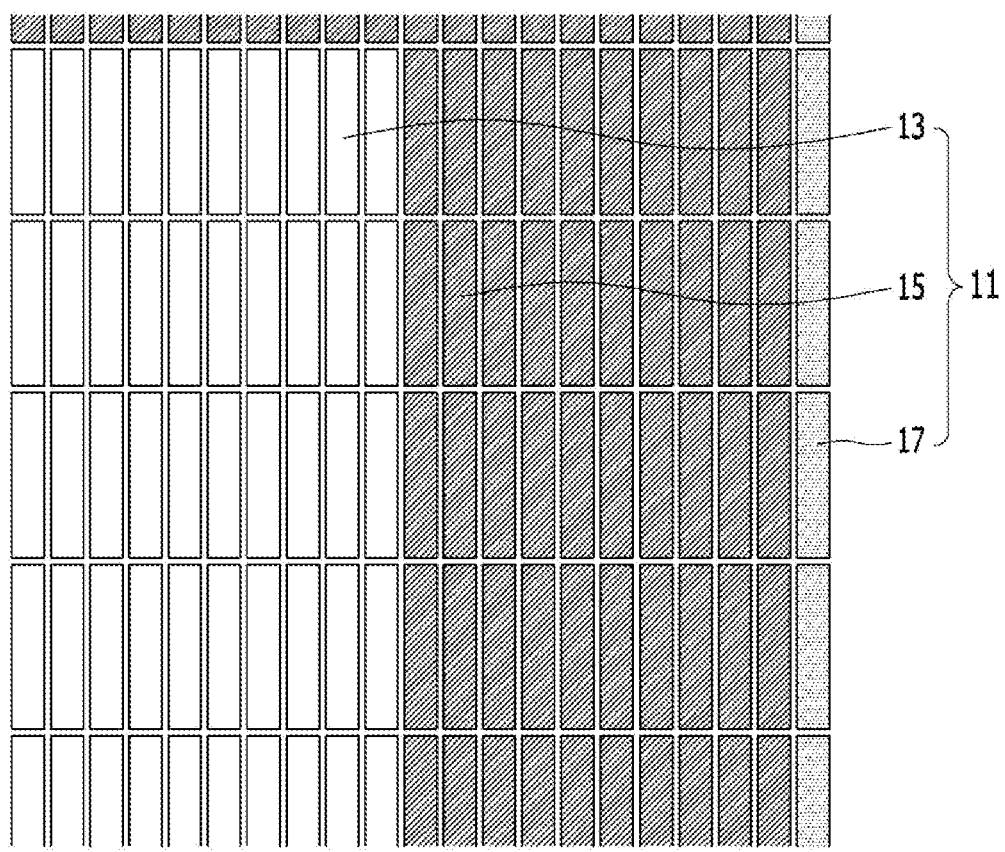

FIGS. 3, 6 and 7 show a method of generating a cell 11 according to an embodiment of the present invention. The method may comprise step of (s145) defining the dummy cell 17 area, the main cell 13 area, and the redundant cell 15 area included in one mat 7, step of (s146) producing a plurality of dummy cells 17 based on a gap between dummy cells 17 in the dummy cell area, step of (s147) producing a plurality of main cells 13 based on the number of main cells 13 and a gap between main cells 13 in the main cell 13 area, step of (s148) producing a plurality of redundant cells 15 based on the number of redundant cells 15 and a gap between redundant cells 15 in the redundant cell 15 area, and step of (s149) producing a cell layer by dividing the dummy cell area, the main cell area, and the redundant cell area, respectively.

The step of (s145) defining the dummy cell area, the main cell area, and the redundant cell area included in one of the mats 7, step of defining an area by dividing into the dummy cell 17, the main cell 13 in which a semiconductor circuit pattern is generated, and the redundant cell 15 for repair or replacement of main cell 13 due to occurrence of defects as sub-cells 11 that are divided according to functions with respect to one of the cells 11.

In this case, the size of the main cell 13 and the redundant cell 15 may be calculated by subtracting the size of the dummy cell 13 from the size of the mat.

Next, step of (s146) producing a plurality of dummy cells based on a gap between cells 11 in the dummy cell area is the step of sequentially generating the cells 17 for each sub-cell 11 defined in step s145, which is a step of generating dummy cells 17 using the gap between dummy cells in the dummy cell area among them.

Here, the gap between cells may be defined as "gap.x=20;" and "gap.y=20;". Further, the size of the dummy cell may be defined as "dummysize.left=2000;", "dummysize.right=2000;", "dummysize.bottom=2000;" and "dummysize.top=2 000;". The number of dummy cells may be defined as "dummy.left=5;", "dummyright=5;", "dummy.bottom=5;" and "dummy.top=2000;".

Next, in step of (s147) producing a plurality of main cells 13 based on the number of main cells and a gap between main cells in the main cell area, the main cells 13 may be generated in the main cell 13 area using a gap between cells as many as the number of the main cells 13 in the up, down, right and left directions.

Here, the number of main cells 13 may be defined as "cell.x=768;" and "cell.y=512".

Next, in step of (s148) producing a plurality of redundant cells 15 based on the number of redundant cells 15 and a gap between redundant cells 15 in the redundant cell area, the redundant cells 15 may be generated in the redundant cell 15 area using a gap between cells as many as the number of the redundant cells 15 in the up, down, right and left directions.

Here, the number of redundant cells 15 may be defined as "redunduncy.left=10;", "redunduncy.right=10;", "redunduncy.bottom=10;", and "redunduncy.top=10;".

In particular, the order of steps s147 and s148 described above may be changed.

Next, as step of (s149) producing a cell layer by dividing the dummy cell area, the main cell area, and the redundant cell area, respectively. A cell layer can be created by classifying the dummy cell layer, the main cell layer, and the redundant cell layer according to the type of cell created in each region. Thereafter, the wafer map may be expressed by combining the layers generated in the previous step.

Hereinafter, a method of providing a wafer test result using a wafer map produced through the above-described procedure is described in detail with reference to the drawings.

Figure 8:
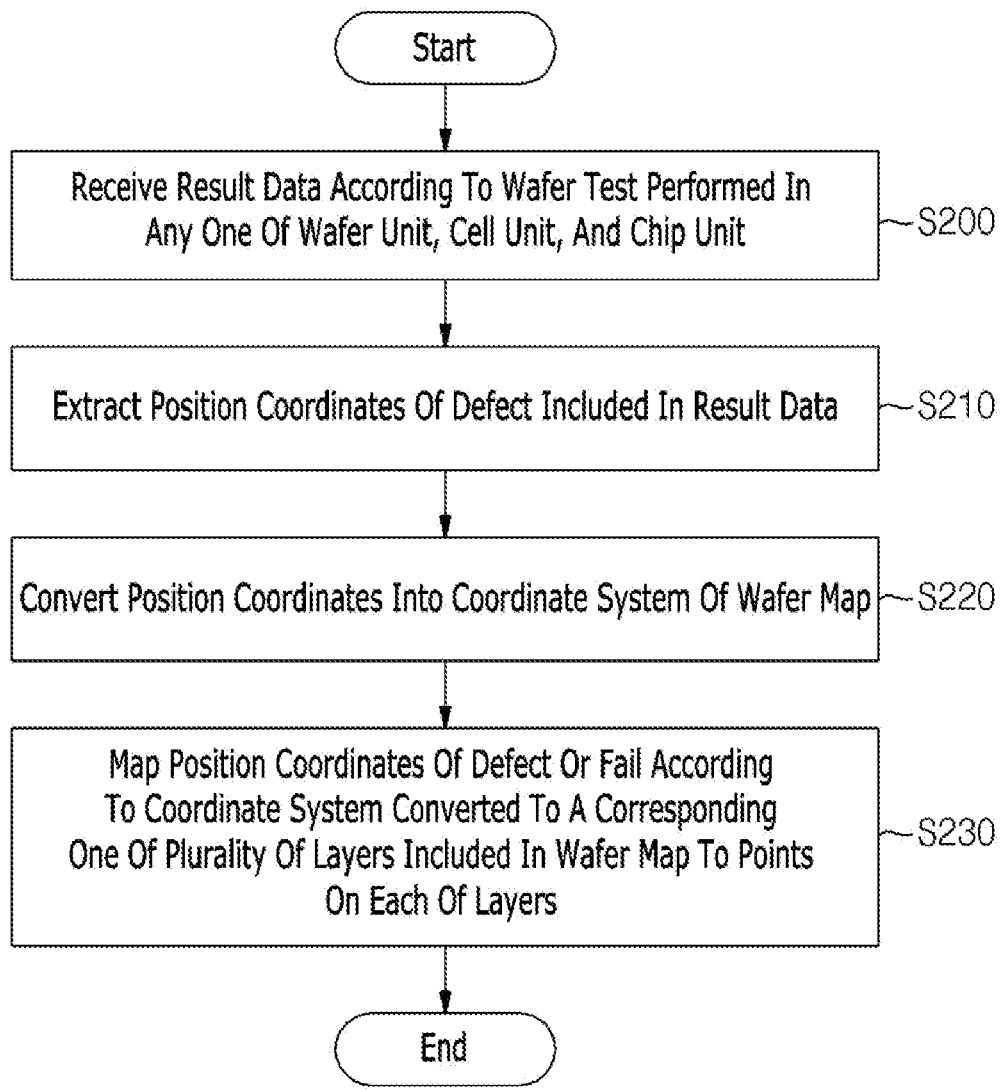
FIG. 8 is a view illustrating a method for providing a wafer test result using a GIS-based spatial wafer map according to an embodiment of the present invention.
Figure 10:
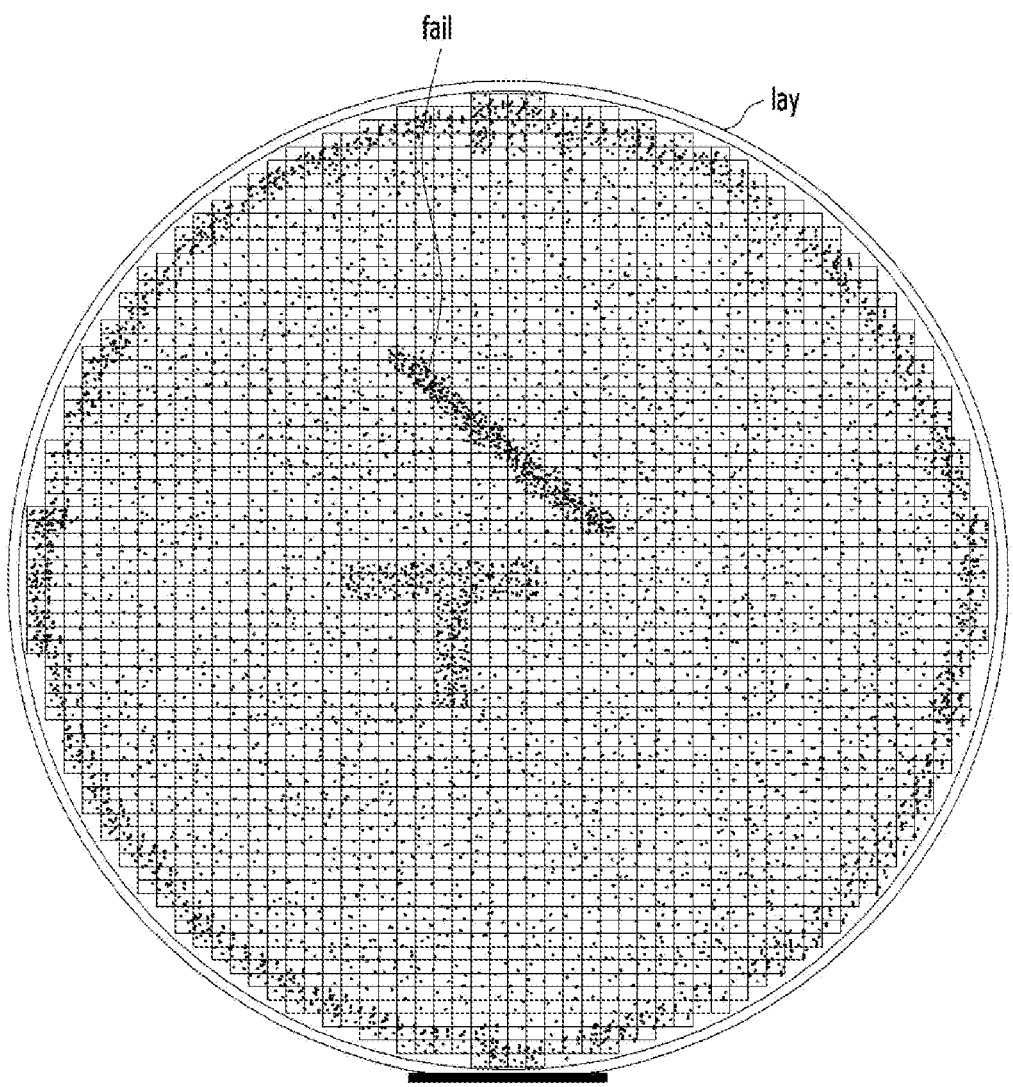
Figure 11:
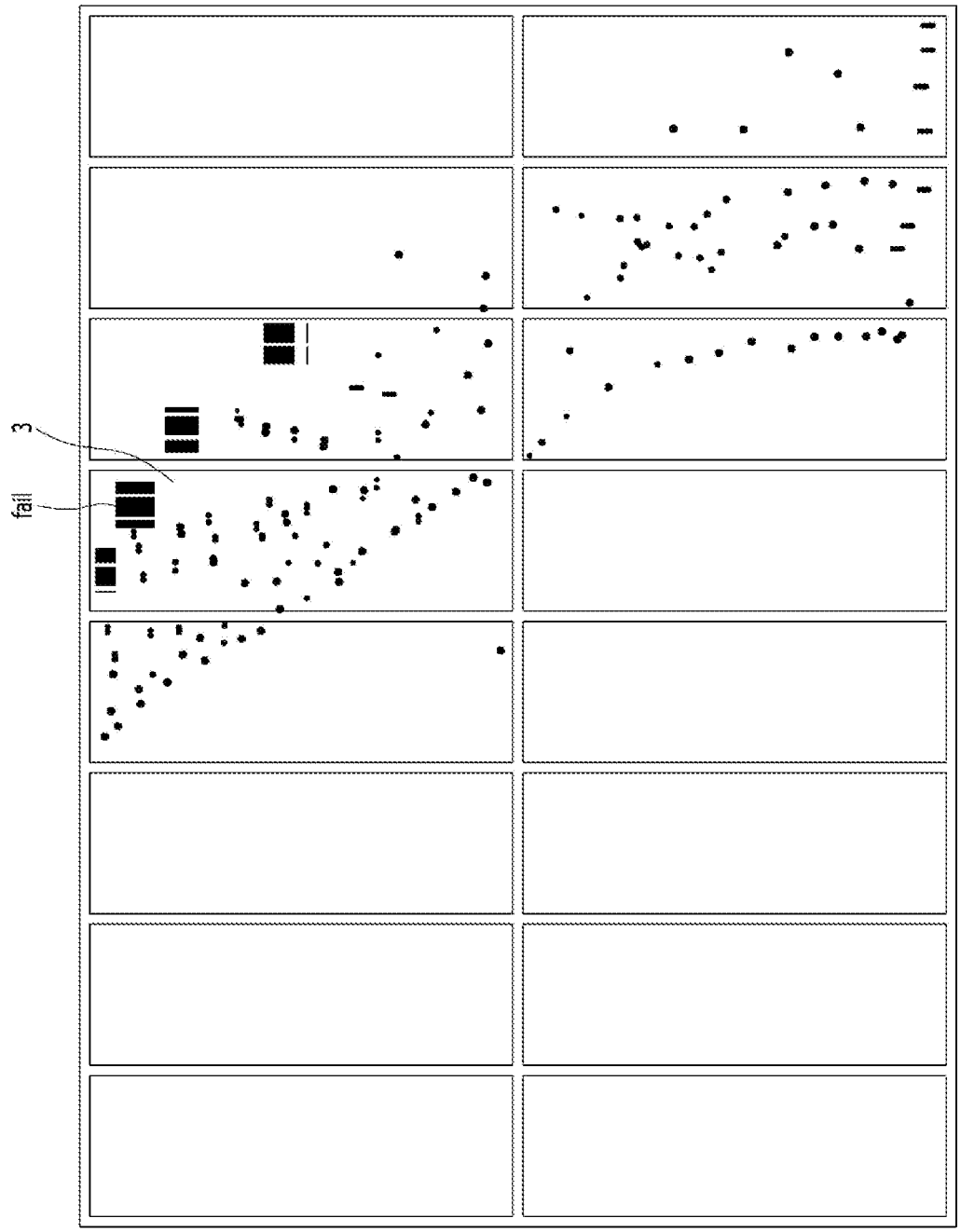
Figure 12:
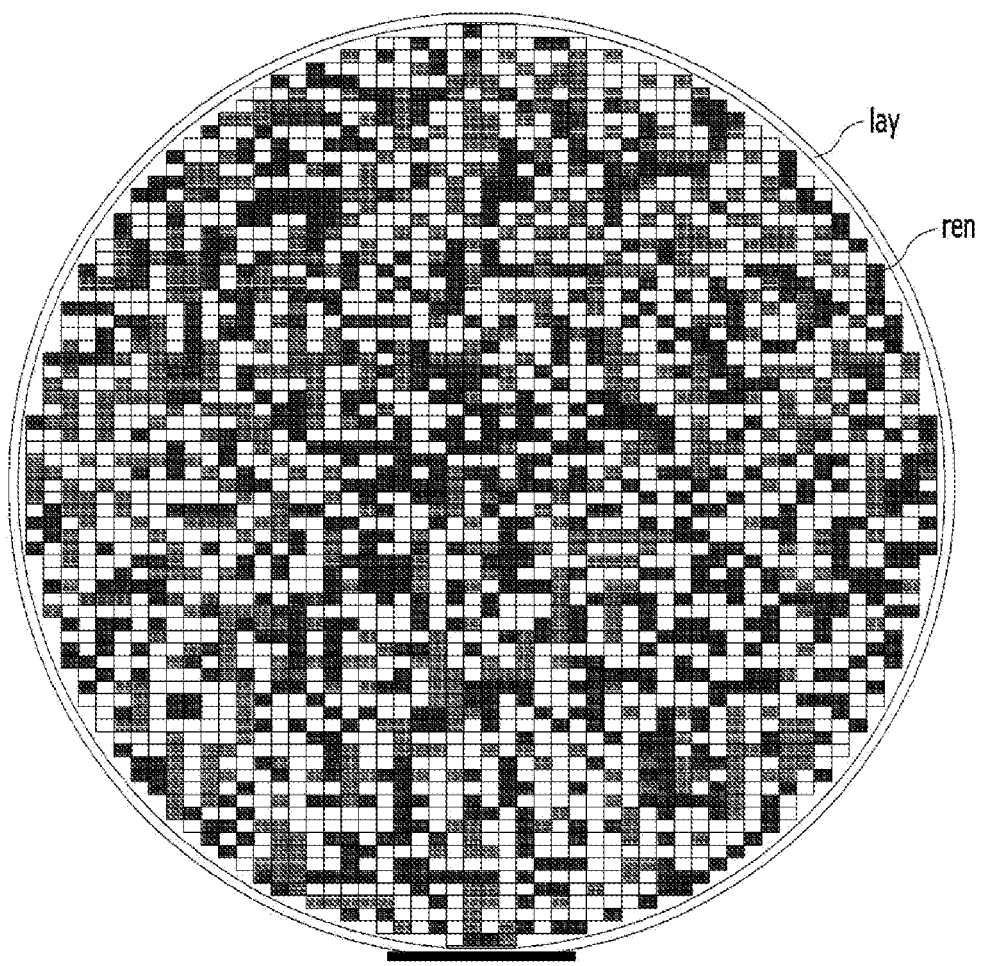

FIG. 8 shows a method for providing wafer test results using the GIS-based spatial wafer map according to an embodiment of the present invention and FIGS. 9, 10, 11, and 12 are views exemplifying wafer test results derived by a method for providing wafer test results using the GIS-based spatial wafer map according to an embodiment of the present invention.

FIGS. 8 and 9 to 11, a method for providing wafer test results using a wafer map, according to an embodiment of the present invention, may include step (s200) of receiving result data according to a wafer test performed in any one of a wafer unit, a cell unit, and a chip unit, step (s210) of extracting the position coordinates of the defect or fail included in the result data, step (s220) of converting the position coordinates into a coordinate system of the wafer map, and step (s230) of mapping the position coordinates of defects or fails according to a coordinate system converted to a corresponding one of a plurality of layers included in the wafer map to points on each of layers.

Step (s200) of receiving result data according to a wafer test performed in any one of a wafer unit, a cell unit, and a chip unit is a step of receiving test result data output by various wafer test methods. The wafer unit test may refer to a test for detecting a defect on the surface of a wafer. The cell 11 unit test may refer to a normal test such as a wafer fail bit map (wfbm). Further, the chip (3) unit test may refer to an electrical parameter monitoring (EPM) test which identifies the electrical DC voltage and current characteristic factors of individual devices necessary for the operation of the semiconductor integrated circuit (IC), WFBI (wafer burn-in) test in which a wafer is heated to a certain temperature. Then an ac/dc voltage is applied to find potential failure factors, and a hot & cold test checks whether each of the chips 3 on the wafer is abnormal through an electrical signal at a high or low temperature to identify defects at a specific temperature.

Accordingly, according to an embodiment of the present invention, different test results determined according to the various purposes described above may be received and processed.

Next, step (s210) of extracting the position coordinates of the defect or fail included in the result data is step of extracting by determining the location of the detected defect or fail existing on the wafer according to the above various tests results by the system.

Next, in step (s220) of converting the position coordinates into a coordinate system of the wafer map and step (s230) of mapping the position coordinates of defects or fails according to a coordinate system converted to a corresponding one of a plurality of layers included in the wafer map to points on each of layers, the location of the defect or fail extracted by the system is mapped as a point on each of layers of the wafer map according to the type of test, in which it is mapped by converting it into a coordinate system that may be mapped on the wafer map.

Here, the above-described coordinate system may be expressed by x and y indices that are individually defined for each chip layer and the cell layer of the wafer map.

In other words, it is to create and display a layer having data on points obtained by calculating these position coordinates as coordinates in the coordinate system of the spatial wafer map. In the case of the wafer layer, the location of the defects may be clearly identified through this, and it may be determined whether their locations exist inside/outside chips 3 or banks.

Further, in the case of a cell layer according to a cell 11 unit test, such as WFBM, a cell 11 unit test is performed, and the result value is saved by composing a physical address (x, y pair) in chips 3. Here, the physical address of cells 11 means an address that increases in one direction based on the reference point of chips in the x-direction and y-direction. As it has a unique value in chips 3, this value is used to calculate the position of specific cells 11 in different cell layers, create a fail object corresponding to these cells 11, create a layer only for the fail data of the test, and display it overlaid with the wafer map.

Further, in the case of a chip layer according to the chip 3 unit test, a test layer with measurement values for each test is created based on the chips 3 in the wafer map, and a renderer based on the measurement values for each of chips 3 is created and displayed on the wafer map.

In other words, in the defect test, according to an embodiment of the present invention, the wafer map may generate and display a layer with point data calculated as coordinates in a coordinate system with spatial information using coordinates.

Meanwhile, although not shown, after step s230 described above, according to an embodiment of the present invention, information related to the wafer production process may be further obtained by utilizing the wafer test result using the wafer map described above. It may further comprise step of deriving problems in the production process by analyzing pattern information between a plurality of points by overlapping two or more of the plurality of layers included in the wafer map and displaying the graphic information. A detailed description related to utilizing these wafer test results is described later.

Figure 13:
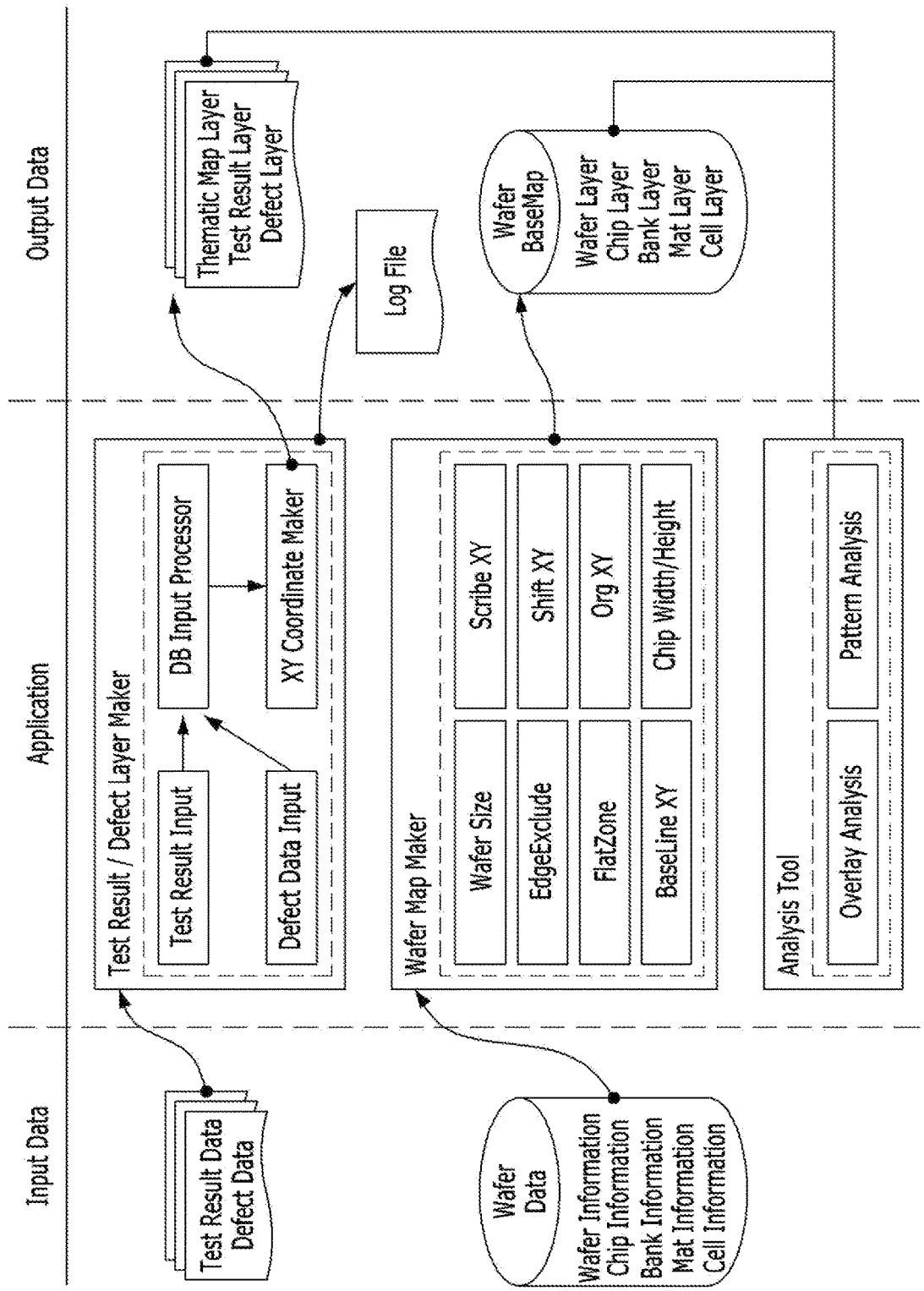
FIGS. 13 and 14 are views illustrating a system's structure for implementing a method for producing the GIS-based spatial wafer map and a method for providing a wafer test result using the same according to an embodiment of the present invention.
Figure 14:
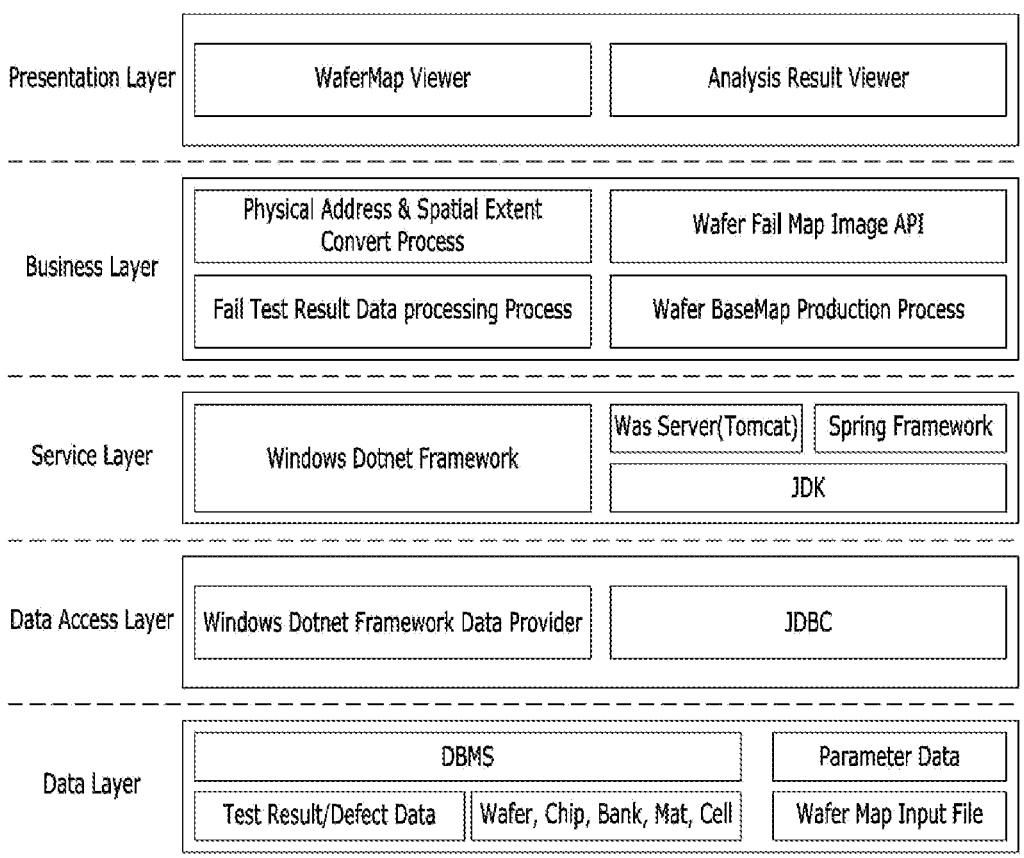

FIGS. 13 and 14 are views showing the structure of a system for implementing a method for producing the GIS-based spatial wafer map and a method for providing wafer test results using the method according to an embodiment of the present invention.

Referring to FIG. 13, a system for implementing a method of producing a wafer map and a method for providing wafer test results using the method according to an embodiment of the present invention provides a client and web-based GIS display and analysis function and may visualize thematic map according to the spatial wafer map and test results and perform spatial analysis.

It may be largely divided into a wafer map maker that generates a wafer map, an analysis tool, and a test/result/defect layer maker.

The wafer map maker is a program that implements the method for producing the GIS-based spatial wafer map according to the embodiment of the present invention described above and may generate a dynamic wafer map by receiving wafer information, chip information, bank information, mat information, and cell information. In this case, generating a plurality of wafer layers is possible by substituting the above-described information into a defined variable and processing it through a plurality of configured program modules. A wafer base map can be created and stored in a database by matching these.

Program modules for this include "Wafer Size", "Scribe XY", "EdgeExclude", "Shift XY", "FlatZone", "BaseLine XY" and "Chip Width/Height".

As the wafer base map generated by such a wafer map maker has a layered structure, it may be composed of a "wafer layer," "chip layer," "bank layer," "mat layer," and "cell layer."

The test result/defect layer maker receives the result data of the defect/fail test performed on the wafer manufactured according to the actual wafer manufacturing process and inputs it into the wafer map to mark the point on the wafer defect or fail for each of layers. The results are provided separately for each layer, which can be seen as visualizing the results for each thematic map of GIS. It may consist of "Test Result Input," "Defect Data Input," "DB Input Processor," "XY Coordinate Maker," etc.

The analysis tool provides a function to analyze the test result from a different point of view using the above-described test result and may provide overlapping analysis and pattern analysis functions.

Further, referring to FIG. 14, the layered architecture of the program implementing the method for producing the GIS-based spatial wafer map according to the embodiment of the present invention is shown by layering The presentation layer may be composed of "WaferMap Viewer," and "Analysis Result Viewer," and the business layer may be composed of "Physical Address & Spatial Extent Convert Process," "Wafer Fail Map Image API," "Fail Test Result Data Processing Process," and "Wafer BaseMap Creation Process."

Further, the service layer may be composed of "Windows Dontnet Framework," "Was Server," "Spring Framework," and "JDK," and a data access layer may be composed of "JDBC," and, the data layer may be composed of "DBMS," "Parameter Data," "Test result/Defect Data," "Wafer, Chip, Bank, Mat, Cell," and "Wafer Map Input File".

Figure 15:
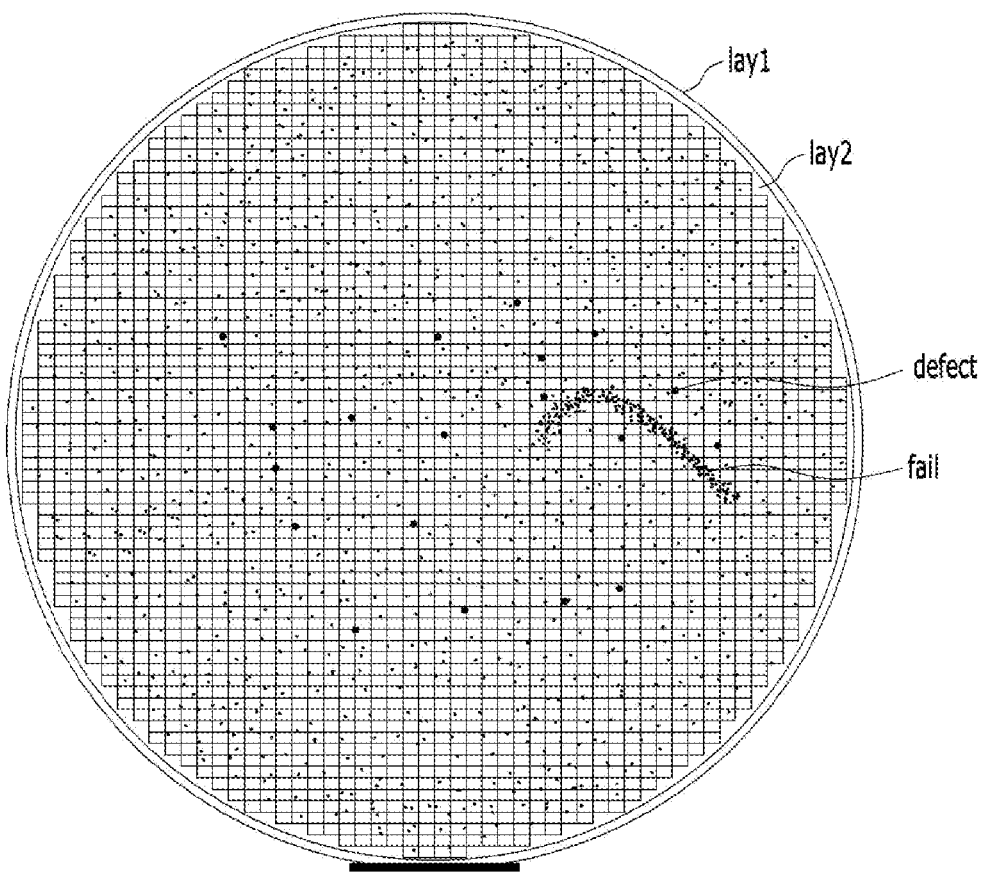
FIGS. 15 and 16 are views illustrating data utilizing wafer test results derived by a method for providing wafer test results using a method for producing the GIS-based spatial wafer map according to an embodiment of the present invention.
Figure 16:
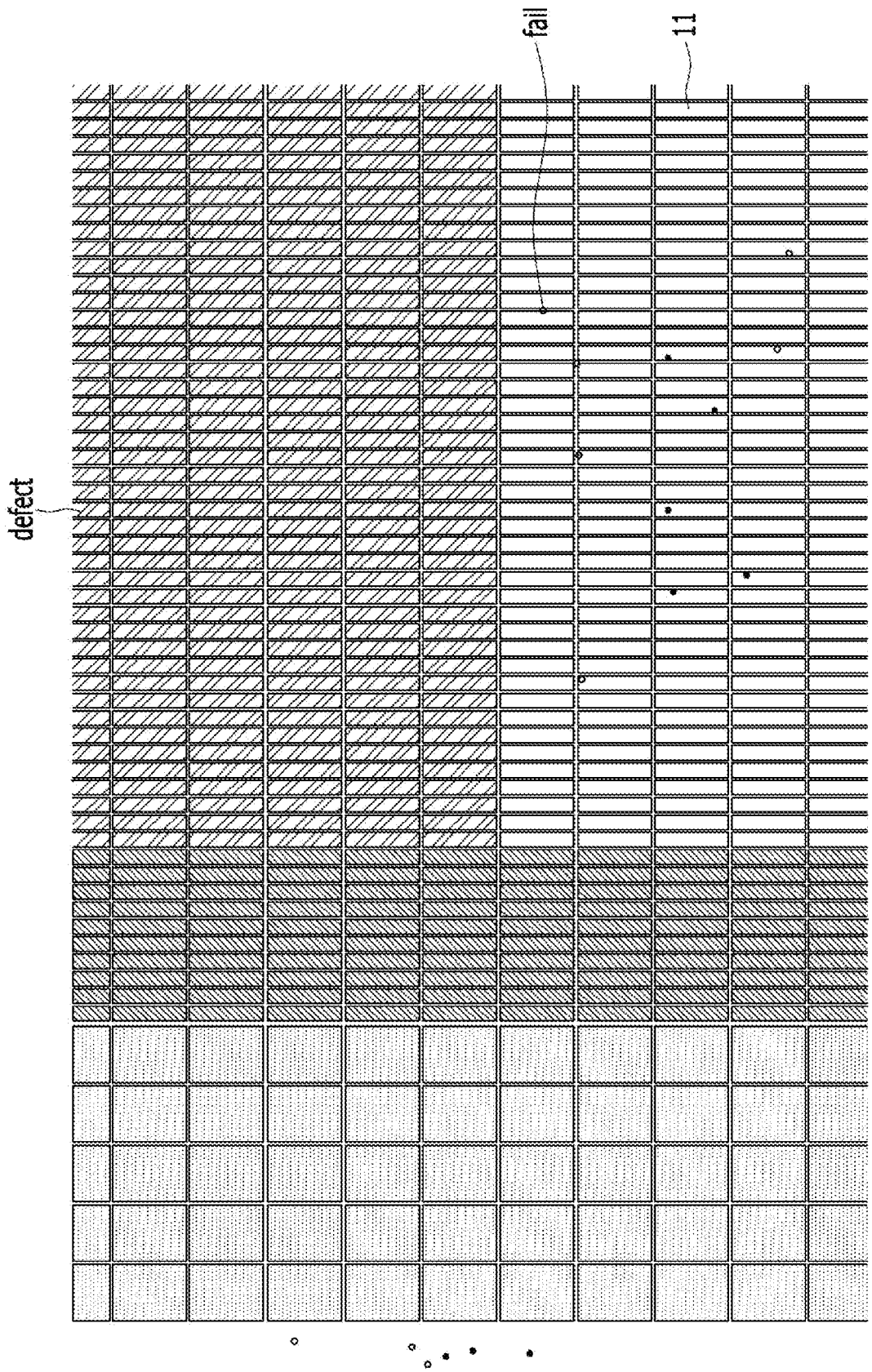

FIGS. 15 and 16 are views illustrating result data using the wafer test derived by the method for providing wafer test results using the GIS-based spatial wafer map according to an embodiment of the present invention.

The spatial wafer map provided by the system according to the embodiment of the present invention may provide a function of analyzing various combinations of each test using layering, which is one of the characteristics of the GIS system.

FIG. 15 illustrates a fail/defect point in a wafer layer. The wafer map of the present invention allows spatial analysis by combining cell fail and defect points displayed in a plurality of layers (lay1, lay2) for a chip, a bank, a mat, and a cell, respectively, and may identify various problems in the chip generation process based on the pattern information of the fail through the overlapping of the two layers (lay1, lay2).

Further, referring to FIG. 16, a fail/defect point in a cell layer is exemplified, and in a cell layer, the spatial relationship between the fail in a unit cell 11, such as a main cell in one of mats 7 and the overlapping defect is checked, and problems in the process can be identified based on this.

Although many matters are specifically described in the above description, these descriptions should not be construed as limiting the scope of the invention but should be construed as examples of preferred embodiments. Therefore, the invention should not be defined by the described embodiments but should be defined by the claims and equivalents to the claims.

The invention claimed is:

1. A method for producing a wafer map, the method comprising:
    step (a) of producing a circular layer corresponding to the horizontal and vertical dimensions in the same plane of an actual semiconductor wafer;
    step (b) of producing an edge region on a circumference portion of the circular layer;
    step (c) of producing one central chip with reference to the size of one of a plurality of chips on the central point of the circular layer;
    step (d) of repeatedly producing chips having the same size as the central chip sequentially from the central chip to the edge region using the size of chips and gap between the chips;
    step (e) of producing, when one of the chips is produced in the edge region, a chip layer including all of the chips on the circular layer; and
    step (f) of producing a dynamic wafer map by producing respective layers for a plurality of components included in one of the chips to produce GIS-based spatial wafer map, wherein the plurality of components includes a plurality of banks included in one of the chips, a mat that divides one of the banks into a multiple part, and a plurality of cells included in one of the mats, and wherein the step (f) comprises:
        step (f1) of producing a bank list based on the number of banks in the column and row directions included in the chips;
        step (f2) of producing a bank layer based on the size of banks and a gap between banks;
        step (f3) of producing a mat list according to a bank type designated for each bank; and
        step (f4) of producing a mat layer based on the size of mats and the gap between mats;
    wherein, GIS is defined as Geographic Information System.

2. The method of claim 1, further comprising, between steps (b) and (c), step (b1) of producing a flat zone on the circular layer in which the edge region is set.

3. The method of claim 1, comprising, after step (f4),
    step of (f5) defining a dummy cell area, a main cell area, and a redundant cell area included in one of the cells;
    step of (f6) producing a plurality of dummy cells based on a gap between cells in the dummy cell area;
    step of (f7) producing a plurality of main cells based on the number of main cells and a gap between main cells in the main cell area;
    step of (f8) producing a plurality of redundant cells based on the number of redundant cells and a gap between redundant cells in the redundant cell area; and
    step of (f9) producing a cell layer by dividing the dummy cell area, the main cell area, and the redundant cell area, respectively.

4. A computer-readable recording medium in which a program for performing the method for preparing the GIS-based spatial wafer map according to claim 1 is recorded.

5. A method for providing a wafer test result using the GIS-based spatial wafer map according to claim 1, the method comprising:
    step (g) of receiving result data according to a wafer test performed in any one of a single wafer, a single cell, and a single chip;
    step (h) of extracting the position coordinates of the defect or fail included in the result data;
    step (i) of converting the position coordinates into a coordinate system of the wafer map; and
    step (j) of mapping the position coordinates of defects or fails according to a coordinate system converted to a corresponding one of a plurality of layers included in the wafer map to points on each of layers.

6. The method of claim 5, wherein the coordinate system uses a GIS-based spatial wafer map generation method expressed by X, Y indices that are individually defined for each of the chip layer and the cell layer of the wafer map.

7. The method of claim 6, comprising, after step (j),
    step (k) of deriving problems in the production process by analyzing pattern information between a plurality of points by overlapping two or more of the plurality of layers included in the wafer map and displaying the same in a graphic.

* * * * *